United States Patent
Lee et al.

(10) Patent No.: US 12,396,219 B2
(45) Date of Patent: Aug. 19, 2025

(54) METAL-OXIDE FILM SEMICONDUCTOR FIELD-EFFECT TRANSISTOR DEVICE AND METHOD FOR MANUFACTURING SAME

(71) Applicant: LG ELECTRONICS INC., Seoul (KR)

(72) Inventors: Hojung Lee, Seoul (KR); Seung Yup Jang, Seoul (KR); Jaemoo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 474 days.

(21) Appl. No.: 17/758,907

(22) PCT Filed: Jan. 16, 2020

(86) PCT No.: PCT/KR2020/000808
§ 371 (c)(1),
(2) Date: Jul. 15, 2022

(87) PCT Pub. No.: WO2021/145484
PCT Pub. Date: Jul. 22, 2021

(65) Prior Publication Data
US 2022/0406889 A1 Dec. 22, 2022

(51) Int. Cl.
*H10D 62/10* (2025.01)
*H10D 30/66* (2025.01)
(Continued)

(52) U.S. Cl.
CPC ......... *H10D 62/112* (2025.01); *H10D 30/665* (2025.01); *H10D 62/107* (2025.01); *H10D 62/393* (2025.01); *H10D 62/8325* (2025.01)

(58) Field of Classification Search
CPC .. H10D 62/106; H10D 62/107; H10D 62/112; H10D 62/153; H10D 62/157;
(Continued)

(56) References Cited

U.S. PATENT DOCUMENTS

2002/0038891 A1  4/2002  Ryu et al.
2006/0192256 A1  8/2006  Cooper et al.
(Continued)

FOREIGN PATENT DOCUMENTS

CN    102194885 A  *  9/2011
JP    2004335917     11/2004
JP    2005310886     11/2005

OTHER PUBLICATIONS

PCT International Application No. PCT/KR2020/000808, Written Opinion of the International Searching Authority dated Oct. 15, 2020, 17 pages.

*Primary Examiner* — Fazli Erdem
(74) *Attorney, Agent, or Firm* — LEE, HONG, DEGERMAN, KANG & WAIMEY

(57) ABSTRACT

The present disclosure can be applied to semiconductor devices and, in particular, relates to a MOSFET device made of silicon carbide and a method for manufacturing same. A metal-oxide film semiconductor field-effect transistor device of the present disclosure may comprise: a drain electrode; a substrate arranged on the drain electrode; an N-type drift layer arranged on the substrate; a current-spreading layer arranged on the drift layer; P-type well layers arranged on the current-spreading layer to define a channel; an N+ region arranged on the well layers; a damage prevention layer adjacent to the N+ region and having a lower N-type doping concentration than that of the N+ region; a P+ region arranged on one side of the channel; a gate oxide layer arranged on the current-spreading layer; a gate layer arranged on the gate oxide layer; and a source electrode arranged on the gate layer.

12 Claims, 10 Drawing Sheets

(51) Int. Cl.
*H10D 62/17* (2025.01)
*H10D 62/832* (2025.01)

(58) Field of Classification Search
CPC ............. H10D 62/393; H10D 62/8325; H10D 12/031; H10D 30/662; H10D 30/665
USPC .......................................................... 257/77
See application file for complete search history.

(56) References Cited

U.S. PATENT DOCUMENTS

2015/0028350 A1* 1/2015 Suvorov ............... H01L 29/872
257/77
2018/0151709 A1 5/2018 Hitachi

* cited by examiner

METAL-OXIDE FILM SEMICONDUCTOR FIELD-EFFECT TRANSISTOR DEVICE AND METHOD FOR MANUFACTURING SAME

CROSS-REFERENCE TO RELATED APPLICATIONS

This application is the National Stage filing under 35 U.S.C. 371 of International Application No. PCT/KR2020/000808, filed on Jan. 16, 2020, the contents of which is hereby incorporated by reference herein in its entirety.

TECHNICAL FIELD

The present disclosure is applicable to a semiconductor device, and particularly, relates to a MOSFET device made of silicon carbide and a manufacturing method therefor.

BACKGROUND ART

Compared to silicon (Si), silicon carbide (SiC) has physical properties such as high breakdown voltage, excellent heat dissipation characteristics, and high temperature operation, and thus a power semiconductor device using SiC has attracted as an alternative to an existing silicon device.

In particular, a silicon carbide MOSFET device made based on these characteristics may propose a solution to replace silicon IGBT (Insulated gate bipolar transistor) and silicon cool MOSFET and to increase power density of a power conversion device. Accordingly, such a silicon carbide MOSFET device has been actively researched and developed in an application field such as a white good, an electric vehicle, and an ESS (energy storage system).

In general, in such a MOSFET device, N-type and P-type doping regions of various concentrations including a well layer defining a channel region may be formed by ion implantation. However, in the ion implantation process, as a concentration of implanted ions is increased, lattice damage highly occurs.

Compared to a silicon (Si) semiconductor, which occupies most of the currently used semiconductor, a high concentration and high energy ion implantation condition may be required to manufacture a silicon carbide (SiC) power semiconductor.

In this process, implanted ions may be damaged while colliding with semiconductor lattices.

In particular, when a concentration of ion implantation exceeds a predetermined level, an annealing process for recovery of such lattice damage may be performed, but at least a portion of such damage remains unrecoverable. That is, in the case of an ion implantation process with a high concentration above a predetermine level, such as general N+ ion implantation, it may be very difficult to recover the semiconductor lattice.

Such permanent damage may act as a factor in increasing leakage current. That is, the N+ ion implantation region, which is damaged by implantation of ions at a high concentration, acts as a cause of generating leakage current at PN junction and causes a decrease in yield. As a result, this phenomenon increases the manufacturing cost of the device.

Accordingly, there is a need for a method for preventing or minimizing lattice damage while ensuring the conductivity of a channel region.

DISCLOSURE

Technical Problem

An object of the present disclosure is to provide a metal-oxide semiconductor field effect transistor device for reducing damage of semiconductor lattice due to an ion implantation process of the metal-oxide semiconductor field effect transistor device.

In detail, an object of the present disclosure is to provide a metal-oxide semiconductor field effect transistor device for reducing junction leakage current between an N+ region and a P-type well layer, thereby improving a device yield.

Technical Solution

As a first aspect for achieving the above object, the present disclosure provides a metal-oxide semiconductor field effect transistor device including a drain electrode, a substrate disposed on the drain electrode, a drift layer of N-type disposed on the substrate, a current diffusion layer disposed on the drift layer, a well layer of P-type disposed on the current diffusion layer and spaced apart from each other to define a channel, an N+ region disposed on the well layer and corresponding to the channel, a damage prevention layer corresponding to the N+ region and having a lower N-type doping concentration than the N+ region, a P+ region disposed at another side of the channel, a gate oxide layer disposed on the current diffusion layer, a gate layer disposed on the gate oxide layer and having at least a portion overlapping the damage prevention layer in a vertical direction, and a source electrode disposed on the gate layer.

The current diffusion layer may be disposed between spaced parts of the well layer of P-type.

The P+ region and the N+ region may be disposed symmetrical to each other based on the current diffusion layer.

A boundary line between the N+ region and the damage prevention layer may correspond to an end of the gate layer in a vertical direction.

The damage prevention layer may be disposed adjacent to the current diffusion layer disposed between the spaced parts of the well layer of P-type.

The damage prevention layer may be disposed symmetrical with the P+ region.

The damage prevention layer may be adjacent to the channel region.

The damage prevention layer may be formed via ion implantation.

As a second aspect for achieving the above object, the present disclosure provides a metal-oxide semiconductor field effect transistor device including a drain electrode, a substrate disposed on the drain electrode, a drift layer of N-type disposed on the substrate, a current diffusion layer disposed on the drift layer, a well layer of P-type disposed on the current diffusion layer and spaced apart from each other to define a channel, an N+ region disposed on the well layer and corresponding to the channel, a damage prevention layer disposed between the well layer and the N+ region and having a lower N-type doping concentration than the N+ region, a P+ region disposed at another side of the channel, a gate oxide layer disposed on the current diffusion layer, a gate layer disposed on the gate oxide layer, and a source element disposed on the gate layer.

At least a portion of the gate layer may overlap the damage prevention layer in a vertical direction.

Advantageous Effects

According to an embodiment of the present disclosure, the following effect may be achieved.

First, according to an embodiment of the present disclosure, it may be possible to reduce damage of semiconductor lattice caused by an ion implantation process by forming a damage prevention layer having an N+ region of a relatively low concentration under both ends of a gate layer.

With such a structure, a junction leakage current between an N+ region and a P-type well layer may be reduced, and a device yield may be improved.

According to another embodiment of the present disclosure, additional technical effects that are not state herein may be achieved. The effect may be understood with reference to the specification and the drawings by one of ordinary skill in the art.

BEST MODE

Figure 1:
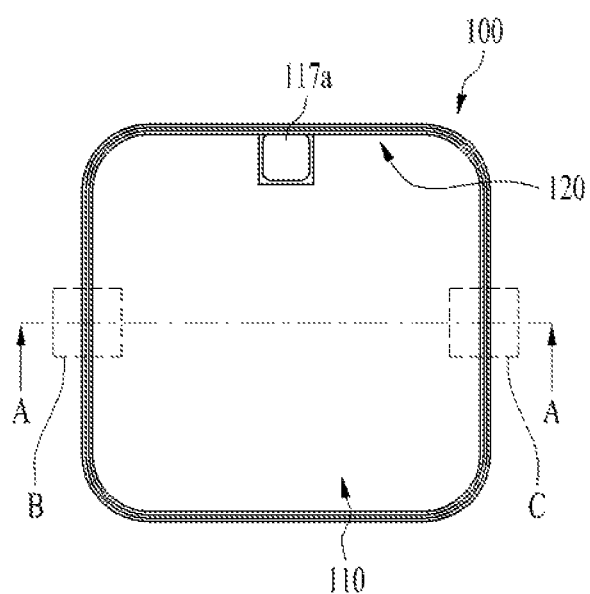
FIG. 1 is a plan view of a metal-oxide semiconductor field effect transistor (MOSFET) device according to an embodiment of the present disclosure.

Hereinafter, the present disclosure will be described in detail by explaining exemplary embodiments of the present disclosure with reference to the attached drawings. The same reference numerals in the drawings denote like elements, and a repeated explanation thereof will not be given. The suffixes "module" and "unit" of elements herein are used for convenience of description and thus can be used interchangeably, and do not have any distinguishable meanings or functions. In the following description of the at least one embodiment, a detailed description of known functions and configurations incorporated herein will be omitted for the purpose of clarity and for brevity. The features of the present disclosure will be more clearly understood from the accompanying drawings and should not be understood to be limited by the accompanying drawings, and it is to be appreciated that all changes, equivalents, and substitutes that do not depart from the spirit and technical scope of the present disclosure are encompassed in the present disclosure.

Furthermore, although each drawing is described for convenience of description, it is also within the scope of the present disclosure that those skilled in the art implement other embodiments by combining at least two or more drawings.

When an element, such as a layer, a region, or a substrate, is referred to as being "on" another component, it may be directly on another element or an intervening element may be present therebetween.

Figure 2:
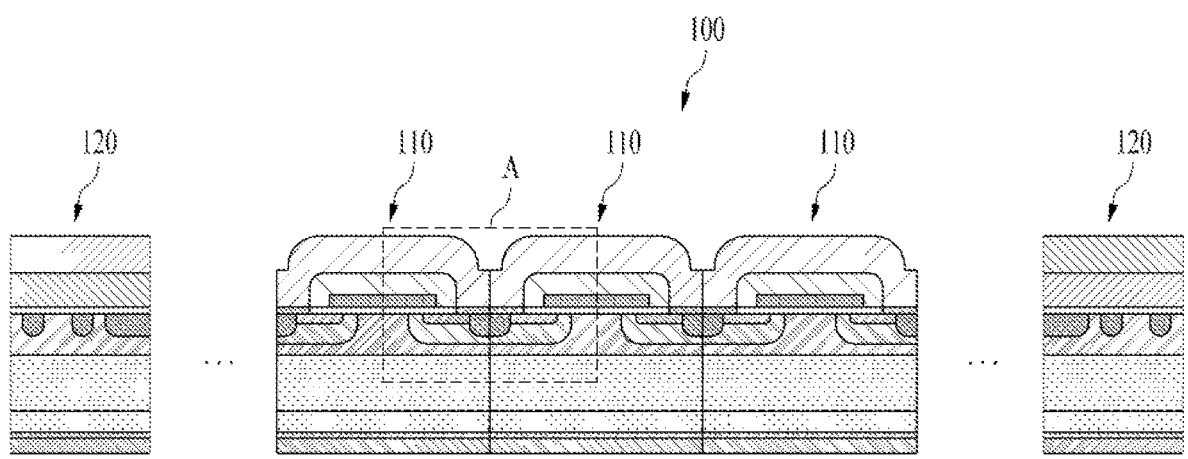
FIG. 2 is a cross-sectional view of the MOSFET taken along a line A-A according to an embodiment of the present disclosure.

FIG. 1 is a plan view of a metal-oxide semiconductor field effect transistor (MOSFET) device according to an embodiment of the present disclosure. FIG. 2 is a cross-sectional view of the MOSFET taken along a line A-A according to an embodiment of the present disclosure.

Referring to FIGS. 1 and 2, a metal-oxide semiconductor field effect transistor (MOSFET) device 100 according to an embodiment of the present disclosure may include an active region 110 and an edge region 120. Hereinafter, for convenience of description, the metal-oxide semiconductor field effect transistor device 100 is referred to as the MOSFET device 100 for short.

In particular, the present disclosure relates to a silicon carbide (SiC) MOSFET device 100.

Compared to silicon (Si), silicon carbide (SiC) has physical properties such as high breakdown voltage, excellent heat dissipation characteristics, and high temperature operation, and thus a power semiconductor device using SiC has attracted as an alternative to an existing silicon device.

In particular, a silicon carbide MOSFET device made based on these characteristics may propose a solution to replace silicon IGBT (Insulated gate bipolar transistor) and silicon cool MOSFET and to increase power density of a power conversion device. Accordingly, such a silicon carbide MOSFET device has been actively researched and developed in an application field such as a white good, an electric vehicle, and an ESS (energy storage system).

The edge region 120 in a left side of FIG. 2 shows a portion B of FIG. 1, and the edge region 120 in a right side of FIG. 2 shows a portion C of FIG. 1.

The active region 110 may be disposed at a central side of the MOSFET device 100, and as shown in FIG. 2, the structure of the same unit element 110 may be repeatedly disposed. A plurality of ring structures 122b spaced apart from each other may be configured to improve withstand voltage characteristics in the edge region 120. This will be described below in detail. Hereinafter, the active region 110 and the unit element 110 will be described using the same reference numeral.

Figure 3:
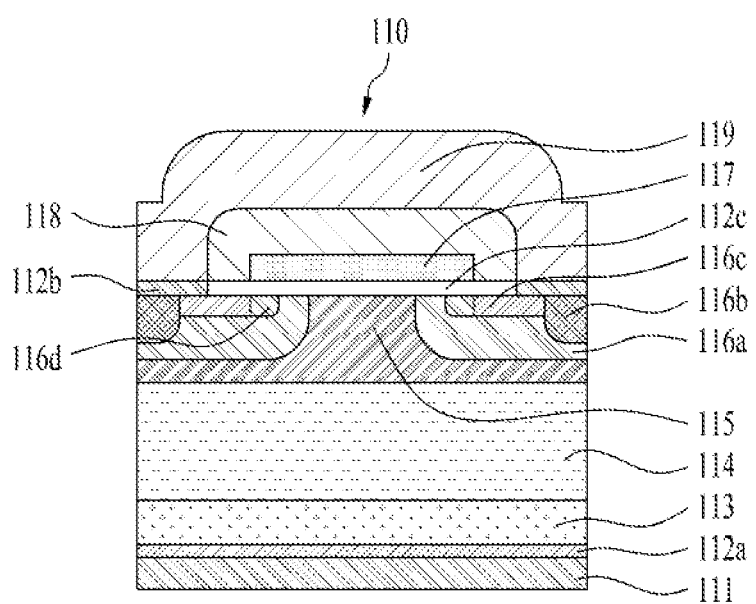
FIG. 3 is a cross-sectional view of a metal-oxide semiconductor field effect transistor device according to an embodiment of the present disclosure.

FIG. 3 is a cross-sectional view of a metal-oxide semiconductor field effect transistor device according to an embodiment of the present disclosure.

FIG. 3 shows the unit element 110 shown in FIGS. 1 and 2. Hereinafter, the structure of the separate unit element 110 will be described in detail with reference to FIG. 3.

A drain electrode 111 may be disposed at a lower side of the separate unit element 110. A source electrode 119 may be disposed at an upper side of the unit element 110. That is, the separate MOSFET unit element 110 may have a vertical structure in which current flows in a vertical direction of the unit element 110.

A substrate 113 may be positioned on the drain electrode 111. A first contact layer 112a may be disposed between the drain electrode 111 and the substrate 113 to aid contact between the drain electrode 111 and the substrate 113. The first contact layer 112a may be formed of Ni silicide.

A drift layer 114 may be disposed on the substrate 113. The drift layer 114 may be a silicon carbide (SiC) substrate or an epitaxial layer, and for example, may be 4H poly type silicon carbide. Hereinafter, epitaxial growth in the specification may refer to a growth method using a raw material, such as CVD (Chemical vapor deposition).

A current diffusion layer 115 may be disposed on the drift layer 114. The current diffusion layer 115 may be formed via epitaxial growth or ion implantation. The current diffusion layer 115 may include a dopant. That is, the current diffusion layer 115 may be formed by introducing a dopant during epitaxial growth or by implanting ions after epitaxial growth.

P-type well layers (P-Well) 116a may be spaced apart from each other at both sides of the unit element on the current diffusion layer 115 to form (define) a channel. The current diffusion layer 115 may be disposed between the well layers 116a. As shown in the drawing, the well layers 116a may be disposed symmetrical to each other based on the current diffusion layer 115 disposed between the well layers 116a.

A gate oxide layer 112c may be disposed on the P-type well layers 116a. In this case, a channel may be formed between the P-type well layers 116a spaced apart from each other and/or a portion at which the P-type well layer 116a is in contact with the gate oxide layer 112c.

An N+ region 116c adjacent to the channel and a P+ region 116b disposed at the other side of the channel may be disposed on the well layer 116a. That is, in the unit element 110 at a portion adjacent to a channel region on the well layer 116a, the two N+ regions 116c may be disposed symmetrical to each other based on the second current diffusion layer 115a, and the P+ regions 116b may be disposed outside the N+ region 116c.

Here, the P+ region 116b may have a higher doping concentration than the p-type well layer 116a. That is, P+ may refer to a higher doping concentration than P. Similarly, the N+ region 116c may have a higher doping concentration than the N-type drift layer 114. N+ may refer to a higher doping concentration than N.

In this case, the P+ region 116b may be thicker than the N+ region 116c. The P+ region 116b may be connected to the unit element 110 adjacent thereto. In other words, the P+ region 116b may be disposed at a boundary between the unit elements 110 adjacent thereto.

The P+ region 116b may be a region for maintaining an energy level of the well layer 116a. For example, the P+ region 116b may be a region for maintaining the well layer 116a at a ground level.

A damage prevention layer 116d with a lower doping concentration than the N+ region 116c may be disposed adjacent to the N+ region 116c. Here, this means that the damage prevention layer 116d has higher resistance than that of the N+ region 116c. That is, since the damage prevention layer 116d has a lower doping concentration than that of the N+ region 116c, the damage prevention layer 116d may have higher resistance than the N+ region 116c. A doping concentration of the damage prevention layer 116d may be higher than that of an N-type semiconductor layer. For example, the damage prevention layer 116d may have a higher doping concentration than a doping concentration of the drift layer 114.

Referring to FIG. 3, the damage prevention layer 116d may be horizontally disposed between the well layer 116a and the N+ region 116c.

All of the well layer 116a, the P+ region 116b, the N+ region 116c, and the damage prevention layer 116d may be formed via ion implantation.

A gate layer 117 may be disposed on the gate oxide layer 112c. The gate layer 117 may be formed of poly silicon. The gate layer 117 may be connected to a gate electrode 117a (refer to FIG. 1) through another portion.

The source electrode 119 may be disposed on the gate layer 117. An interlayer dielectric 118 may be disposed between the gate layer 117 and the source electrode 119.

Second contact layer 112b for aiding contact between the source electrode 119, and the P+ region 116b and the N+ region 116c may be disposed at both sides of the gate oxide layer 112c. The second contact layer 112b may be formed of Ni silicide.

The current diffusion layer 115 may be disposed between the drift layer 114 and the gate oxide layer 112c when viewed in a vertical direction. In detail, the current diffusion layer 115 may be disposed in contact with the gate oxide layer 112c.

As such, from an inverted perspective of the unit element 110, the current diffusion layer 115 may be formed to a depth (thickness) for covering the P-type well layers 116a.

According to an embodiment of the present disclosure, the gate layer 117 may be disposed on the gate oxide layer 112c, and at least a portion of the gate layer 117 may overlap the damage prevention layer 116d in a vertical direction. Here, the vertical direction may refer to a direction in which the drain electrode 111 and the source electrode 119 are connected to each other. For example, the vertical direction may be a direction perpendicular to a main plan of the drain electrode 111.

The damage prevention layers 116d may be disposed below both ends of the gate layer 117, and here, the gate oxide layer 112c may be disposed between the damage prevention layers 116d and the gate layer 117.

As such, it may be possible to reduce damage caused by an ion implantation process by forming the damage prevention layer 116d having an N+ region of a relatively low concentration under both ends of the gate layer 117. With such a structure, a junction leakage current between the N+ region 116c and the P-type well layer (P-well) 116a may be reduced, and a device yield may be improved.

As such, the damage prevention layer 116d may be provided as a portion of an N+ semiconductor, which is partially ion-implanted with a low concentration only on a lower side of the gate layer 117. In such an ion implantation with a low concentration, permanent damage of a SiC semiconductor may be suppressed.

The damage prevention layer 116d may suppress permanent damage of a semiconductor material of a device and may reduce leakage current. A yield of a finally manufactured device may also be increased.

The damage prevention layer 116d may be formed via N+ ion implantation with a low concentration, and thus may have higher resistance than an N+ ion implantation region with a high concentration. Accordingly, in order to minimize a high resistance region, the N+ region with a low concentration may be limited only to a lower side of the gate layer 117.

Figure 4:
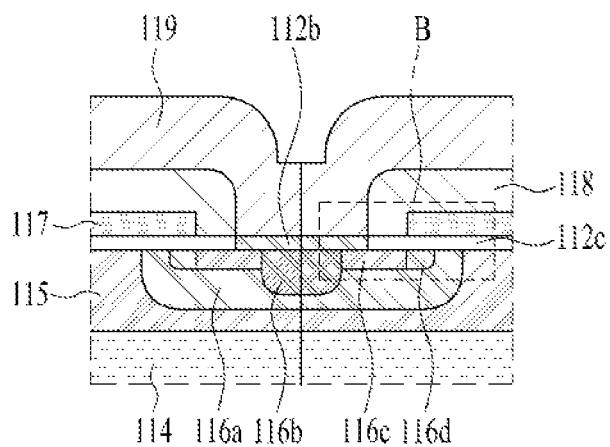
FIG. 4 is an enlarged cross-sectional view of a portion of a metal-oxide semiconductor field effect transistor device according to an embodiment of the present disclosure.

FIG. 4 is an enlarged cross-sectional view of a portion of a metal-oxide semiconductor field effect transistor device according to an embodiment of the present disclosure. FIG. 4 corresponds to a portion A of FIG. 2.

FIG. 4 may correspond to a boundary portion of a unit element. The source electrode 119 may be recessed toward a lower side of a unit element while covering the interlayer dielectric 118 at a boundary portion of the unit element.

In this case, as described above, the second contact layer 112b for contact between the source electrode 119 and the P+ region 116b may be disposed between the source electrode 119 and the P+ region 116b. The second contact layer 112b may be formed of Ni silicide.

The second contact layer 112b may also be in contact with a portion of the N+ region 116c. The gate oxide layers 112c may be disposed at right and left sides of the second contact layer 112b.

As described above, the P+ region 116b may be disposed at one side of the N+ region 116c, and the damage prevention layer 116d with a lower doping concentration than that of the N+ region 116c may be disposed at an opposite side of the N+ region 116c.

In this case, the damage prevention layer 116d may be disposed in contact with one side of the N+ region 116c.

The gate oxide layer 112c may be disposed in contact with at least one a portion of the N+ region 116c and the damage prevention layer 116d.

The damage prevention layer 116d may be horizontally disposed between the portion of the gate oxide layer 112c, which the well layer 116a contacts, and the N+ region 116c.

The damage prevention layer 116d may be disposed between the well layer 116a and the gate oxide layer 112c in a vertical direction.

According to an embodiment of the present disclosure, the gate layer 117 may be disposed on the gate oxide layer 112c, and at least a portion of the gate layer 117 may overlap the damage prevention layer 116d in a vertical direction. Here, the vertical direction may refer to a direction in which the drain electrode 111 and the source electrode 119 are connected.

As such, it may be possible to reduce damage caused by an ion implantation process by forming the damage prevention layer 116d having an N+ region of a relatively low concentration under both ends of the gate layer 117. With such a structure, a junction leakage current between the N+ region 116c and the P-type well layer (P-well) 116a may be reduced, and a device yield may be improved.

Figure 5:
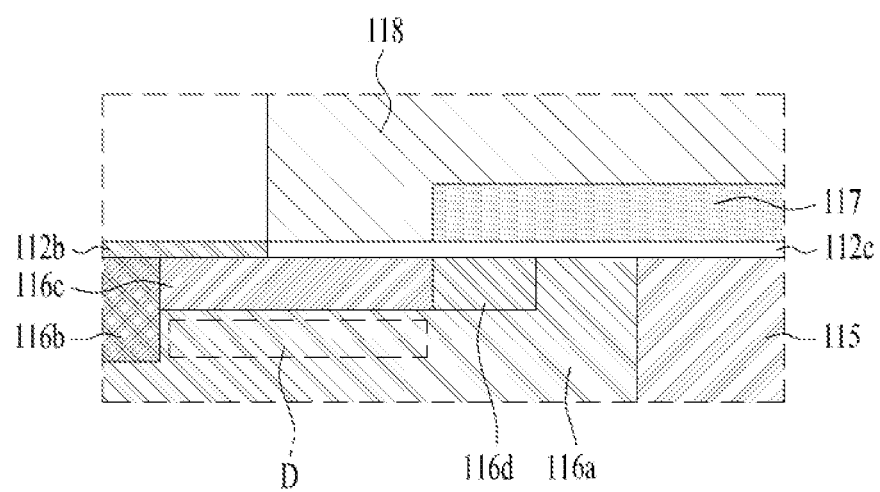
FIG. 5 is an enlarged cross-sectional view of a portion of a metal-oxide semiconductor field effect transistor device according to an embodiment of the present disclosure.

FIG. 5 is an enlarged cross-sectional view of a portion of a metal-oxide semiconductor field effect transistor device according to an embodiment of the present disclosure. FIG. 5 corresponds to a portion B of FIG. 4.

Referring to FIG. 5, the damage prevention layer 116d may be horizontally disposed in contact between the portion of the gate oxide layer 112c, which the well layer 116a contacts, and the N+ region 116c.

The damage prevention layer 116d may be disposed between the well layer 116a and the gate oxide layer 112c in a vertical direction.

According to an embodiment of the present disclosure, the gate layer 117 may be disposed on the gate oxide layer 112c, and at least a portion of the gate layer 117 may overlap the damage prevention layer 116d in a vertical direction. Here, the vertical direction may refer to a direction in which the drain electrode 111 and the source electrode 119 are connected.

In this case, a boundary line between the N+ region 116c and the damage prevention layer 116d may coincide with an end of the gate layer 117 in a vertical direction. That is, the boundary line between the N+ region 116c and the damage prevention layer 116d may substantially coincide with a boundary line between the end of the gate layer 117 and the interlayer dielectric 118 in a vertical direction. Here, substantially coincident may mean that elements match within an alignment error range of semiconductor manufacturing equipment.

As such, according to the present disclosure, semiconductor lattice damage may be minimized by reducing a concentration of ion implantation of the N+ region 116c below the gate layer 117 to form the damage prevention layer 116d.

Therethrough, junction leakage current between the N+ region 116c and the well layer 116a may be reduced.

As described above, the damage prevention layer 116d ion-implanted with a low concentration, that is, having a relatively low doping concentration may be partially disposed below the gate layer 117, and thus damage may be suppressed in a region having a low doping concentration (N+ ion implantation of a low concentration).

That is, permanent damage may occur in a portion D positioned below the N+ region 116c of FIG. 5, but this damage may be limited to a lower side of the N+ region 116c. That is, permanent damage may not occur below the damage prevention layer 116d.

However, the N+ ion implantation region with a low concentration may have higher resistance than an N+ ion implantation with a high concentration, but in order to minimize high resistance, the width of the N+ ion implantation with a low concentration N+ ion implantation region, that is, the damage prevention layer 116d may be limited to a portion that overlaps a lower side of the gate layer 117.

A region of the part D may be substantially disposed away from a channel region (a region of the well layer 116a, positioned immediately below the gate oxide layer 112c). Accordingly, leakage current may be reduced.

Figure 6:
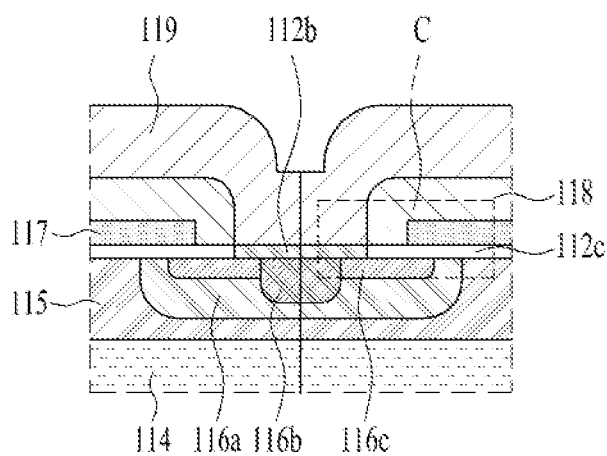
FIG. 6 is an enlarged cross-sectional view of a portion of a metal-oxide semiconductor field effect transistor device according to a comparative example of the present disclosure.

FIG. 6 is an enlarged cross-sectional view of a portion of a metal-oxide semiconductor field effect transistor device according to a comparative example of the present disclosure.

Figure 7:
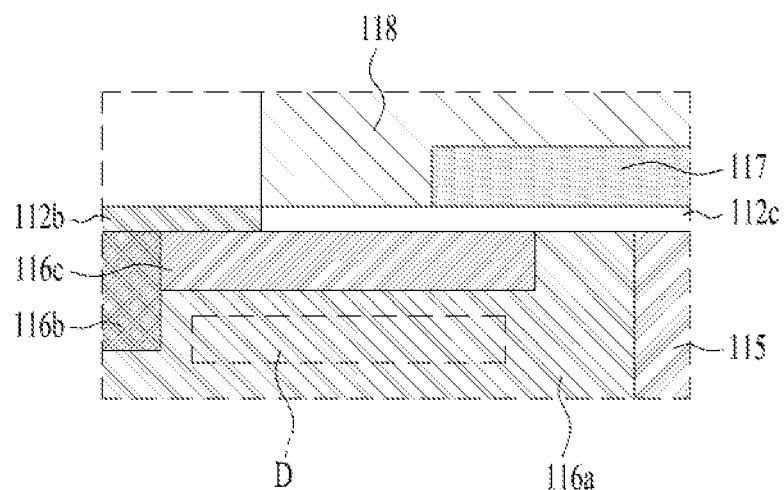
FIG. 7 is a further enlarged cross-sectional view of a portion of a metal-oxide semiconductor field effect transistor device according to a comparative example of the present disclosure.

FIG. 7 is a further enlarged cross-sectional view of a portion of a metal-oxide semiconductor field effect transistor device according to a comparative example of the present disclosure. FIG. 7 corresponds to a portion C of FIG. 6.

Referring to FIGS. 6 and 7, the N+ region 116c may be ion-implanted with a high concentration to a lower side of the gate layer 117.

In general, in the ion implantation process, as a concentration of implanted ions is increased, lattice damage highly occurs.

Compared to a silicon (Si) semiconductor, which occupies most of the currently used semiconductor, a high concentration and high energy ion implantation condition may be required to manufacture a silicon carbide (SiC) power semiconductor.

However, in this process, implanted ions may be damaged while colliding with semiconductor lattices.

That is, permanent damage may occur in a portion E positioned below the N+ region 116c of FIG. 7. The damaged portion E may be positioned along the lower side of the N+ region 116c. It may be seen that a region of the damaged portion E may be larger than the portion D of FIG. 5.

In particular, when a concentration of ion implantation exceeds a predetermined level, an annealing process for recovery of such lattice damage may be performed, but at least a portion of such damage remains unrecoverable. That is, in the case of an ion implantation process with a high concentration above a predetermine level, such as general N+ ion implantation, it may be very difficult to recover the semiconductor lattice.

Such permanent damage may act as a factor in increasing leakage current. That is, the N+ ion implantation region, which is damaged by implantation of ions at a high concentration, acts as a cause of generating leakage current at PN junction and causes a decrease in yield. As a result, this phenomenon increases the manufacturing cost of the device.

Figure 8:
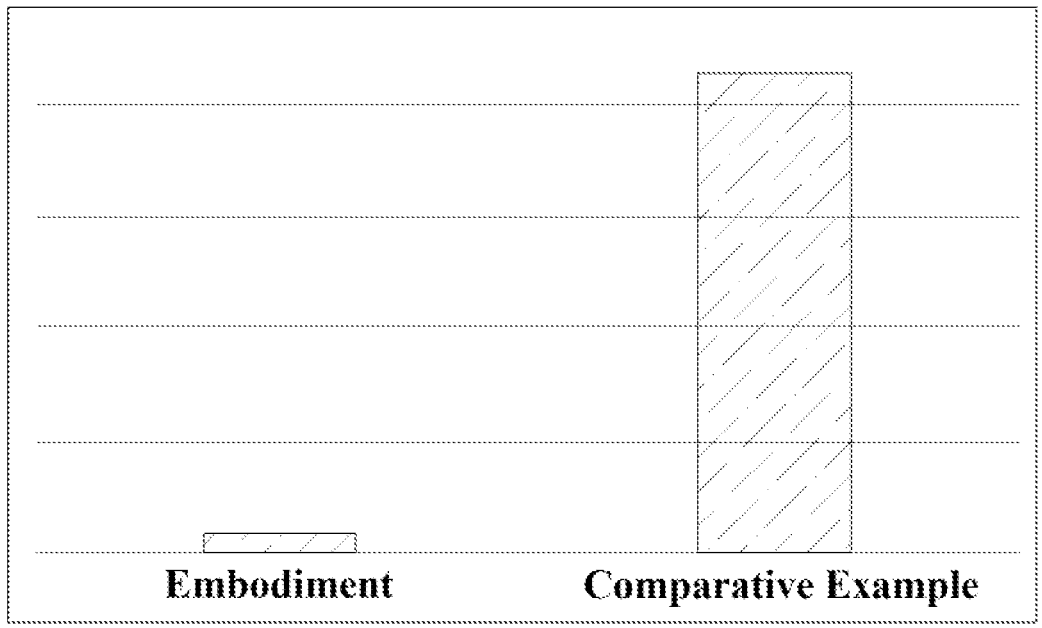
FIG. 8 is a graph showing total leakage current of a metal-oxide semiconductor field effect transistor device according to an embodiment and a comparative example of the present disclosure.

FIG. 8 is a graph showing total leakage current of a metal-oxide semiconductor field effect transistor device according to an embodiment and a comparative example of the present disclosure. For example, FIG. 8 shows leakage current when 1200 Vds is applied.

As seen from FIG. 8, leakage current of a MOSFET according to an embodiment of the present disclosure may be largely reduced.

Figure 9:
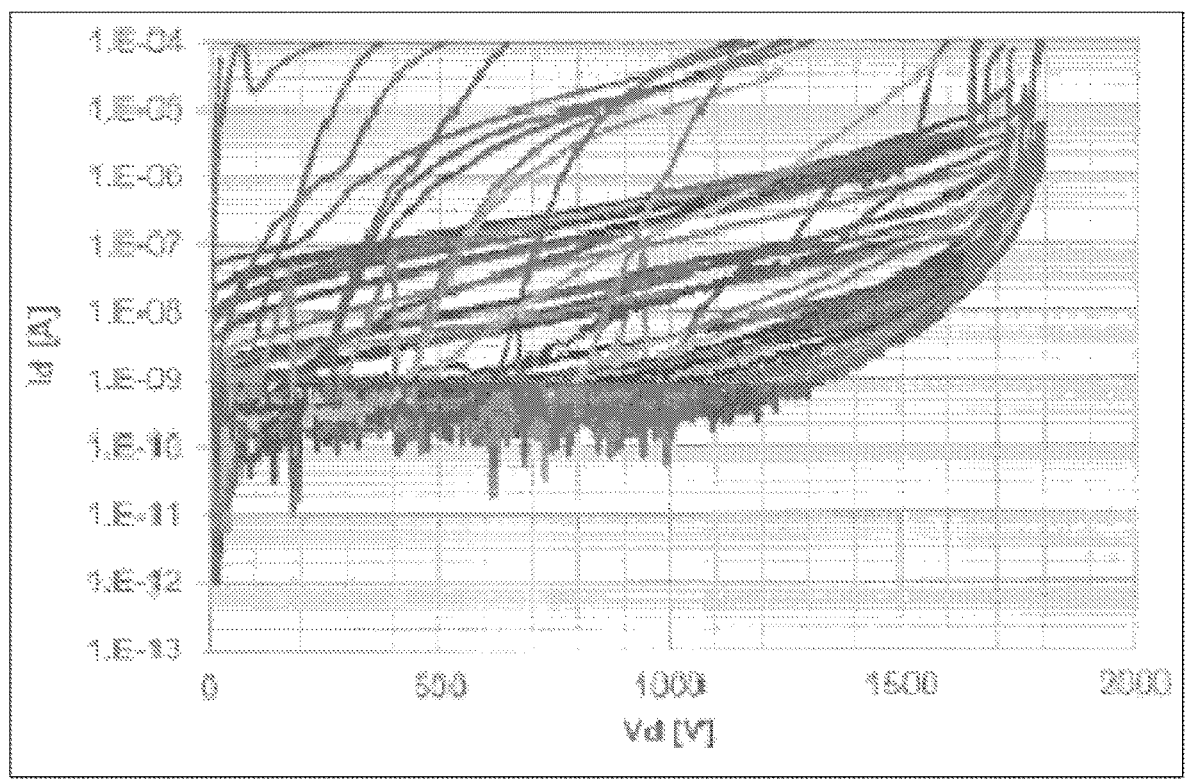
FIG. 9 is a graph showing leakage current along with application of a voltage of a metal-oxide semiconductor field effect transistor device according to a comparative example.
Figure 10:
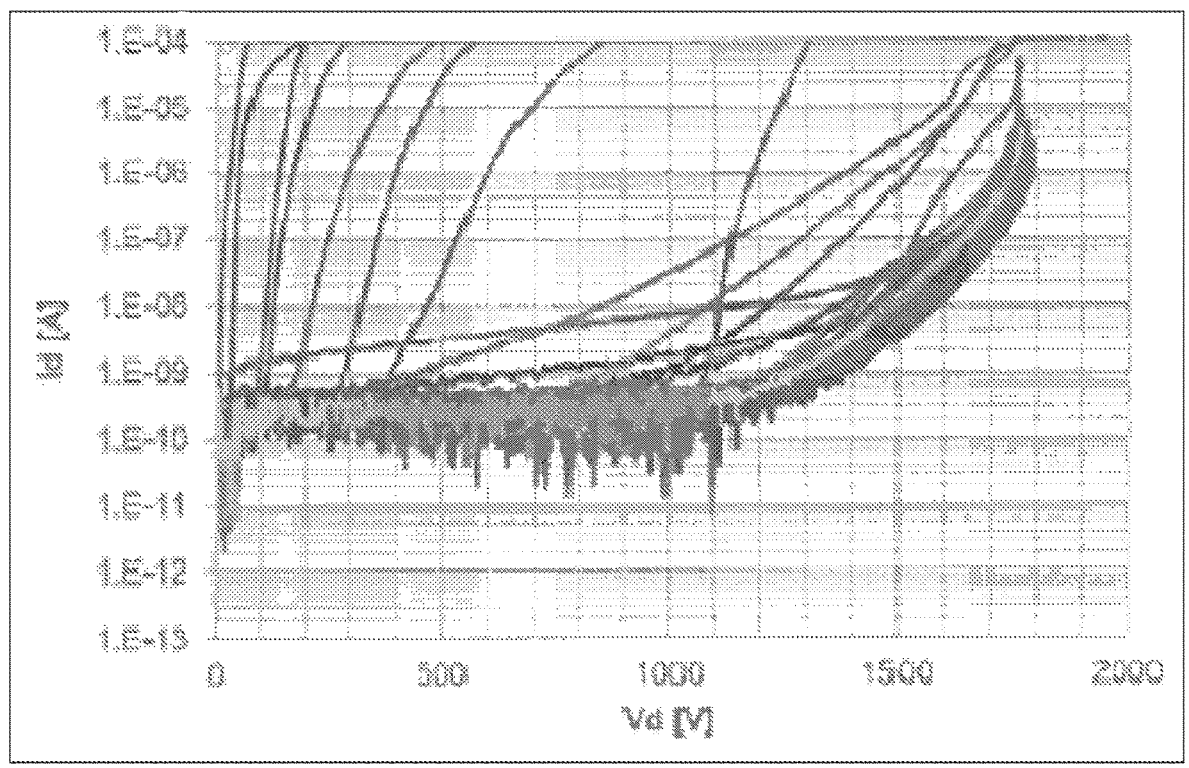
FIG. 10 is a graph showing leakage current along with application of a voltage of a metal-oxide semiconductor field effect transistor device according to an embodiment of the present disclosure.

FIG. 9 is a graph showing leakage current along with application of a voltage of a metal-oxide semiconductor field effect transistor device according to a comparative example. FIG. 10 is a graph showing leakage current along with application of a voltage of a metal-oxide semiconductor field effect transistor device according to an embodiment of the present disclosure.

For example, FIGS. 9 and 10 show a graph in which measurement results of 55 MOSFET devices are accumulated.

FIGS. 9 and 10 are graphs showing measurement obtained by applying a reverse current from 0 to 2000 V in a metal-oxide semiconductor field effect transistor device according to a comparative example and an embodiment of the present disclosure, respectively.

In FIG. 9, lines positioned in a substantially vertical direction may mean that a device defect due to leakage current occurs at a corresponding voltage. In addition, wide distribution of horizontally positioned lines may mean that an average value of basic leakage current is large.

As seen from FIG. 10, lines positioned in a vertical direction may be significantly reduced compared with FIG. 9. In addition, narrow distribution of horizontally positioned lines may mean that an average value of basic leakage current is small.

As such, it may be seen that, in the metal-oxide semiconductor field effect transistor device according to an embodiment of the present disclosure, leakage current converges downward, thereby improving leakage current and a yield.

As such, according to an embodiment of the present disclosure, it may be possible to reduce damage of semiconductor lattice caused by an ion implantation process by forming the damage prevention layer 116d having an N+ region of a relatively low concentration under both ends of the gate layer 117.

With such a structure, a junction leakage current between the N+ region 116c and the P-type well layer (P-well) 116a may be reduced, and a device yield may be improved.

That is, in the damage prevention layer 116d as an ion implantation region with a low concentration, permanent damage of a silicon carbide (SiC) semiconductor may be suppressed.

The damage prevention layer 116d may suppress permanent damage of a semiconductor material of a device and may reduce leakage current. A yield of a finally manufactured device may also be increased.

In this case, the damage prevention layer 116d may be formed via N+ ion implantation with a low concentration, and thus may have higher resistance than an N+ ion implantation region with a high concentration. Accordingly, in order to minimize a high resistance region, the N+ region with a low concentration may be limited only to a lower side of the gate layer 117.

The above description is merely illustrative of the technical idea of the present disclosure, and various modifications and variations are possible without departing from the essential characteristics of the present disclosure by those of ordinary skill in the art to which the present disclosure pertains.

Accordingly, the embodiments disclosed in the present disclosure are not intended to limit the technical spirit of the present disclosure, but to explain, and the scope of the technical spirit of the present disclosure is not limited by these embodiments.

The scope of the present disclosure should be interpreted by the claims below, and all technical ideas within the scope equivalent thereto should be construed as being included in the scope of the present disclosure.

INDUSTRIAL AVAILABILITY

The present disclosure may provide a metal-oxide semiconductor field effect transistor device formed of a silicon carbide material.

What is claimed is:

1. A metal-oxide semiconductor field effect transistor device comprising:
   a drain electrode;
   a substrate disposed on the drain electrode;
   a drift layer of N-type disposed on the substrate;
   a current diffusion layer disposed on the drift layer;
   a well layer of P-type disposed on the current diffusion layer and spaced apart from each other to define a channel;
   an N+ region disposed on the well layer and corresponding to the channel;
   a damage prevention layer neighboring the N+ region and having a N-type doping concentration lower than the N+ region;
   a P+ region disposed at another side of the channel;
   a gate oxide layer disposed on the current diffusion layer;
   a gate layer disposed on the gate oxide layer and having at least a portion overlapping the damage prevention layer in a vertical direction; and
   a source electrode disposed on the gate layer,
   wherein a boundary line between the N+ region and the damage prevention layer corresponds to an end of the gate layer in the vertical direction.

2. The metal-oxide semiconductor field effect transistor device of claim 1, wherein the current diffusion layer is disposed between spaced parts of the well layer of P-type.

3. The metal-oxide semiconductor field effect transistor device of claim 2, wherein the P+ region and the N+ region are disposed symmetrical to each other based on the current diffusion layer.

4. The metal-oxide semiconductor field effect transistor device of claim 2, wherein the damage prevention layer is disposed neighboring the current diffusion layer disposed between the spaced parts of the well layer of P-type.

5. The metal-oxide semiconductor field effect transistor device of claim 1, wherein the damage prevention layer is disposed symmetrical with the P+ region.

6. The metal-oxide semiconductor field effect transistor device of claim 1, wherein the damage prevention layer is adjacent to the channel.

7. The metal-oxide semiconductor field effect transistor device of claim 1, wherein the damage prevention layer is formed via ion implantation.

8. A metal-oxide semiconductor field effect transistor device comprising:

a drain electrode;
a substrate disposed on the drain electrode;
a drift layer of N-type disposed on the substrate;
a current diffusion layer disposed on the drift layer;
a well layer of P-type disposed on the current diffusion layer and spaced apart from each other to define a channel;
an N+ region disposed on the well layer and adjacent to the channel;
a damage prevention layer disposed between the well layer and the N+ region and having a lower N-type doping concentration than the N+ region;
a P+ region disposed at another side of the channel;
a gate oxide layer disposed on the current diffusion layer;
a gate layer disposed on the gate oxide layer; and
a source element disposed on the gate layer,
wherein a boundary line between the N+ region and the damage prevention layer corresponds to an end of the gate layer in a vertical direction.

9. The metal-oxide semiconductor field effect transistor device of claim 8, wherein at least a portion of the gate layer overlaps the damage prevention layer in the vertical direction.

10. The metal-oxide semiconductor field effect transistor device of claim 8, wherein the P+ region and the N+ region are disposed symmetrical to each other based on the current diffusion layer.

11. The metal-oxide semiconductor field effect transistor device of claim 8, wherein the damage prevention layer is disposed symmetrical with the P+ region.

12. The metal-oxide semiconductor field effect transistor device of claim 8, wherein the damage prevention layer is formed via ion implantation.

* * * * *